United States Patent Office 3,064,562

Patented Nov. 20, 1962

3,064,562

ACRYLIC ACID MONOMER COATINGS FOR METAL BASES

Elmer F. Deal, West Covina, Calif., assignor to Lithoplate, Inc., a corporation of California No Drawing. Filed Jan. 12, 1959, Ser. No. 786,034
11 Claims. (Cl. 101—149.2)

This invention relates to a lithographic plate base adapted to receive a light sensitive coating, methods of preparing such a base and to lithographic plates including such a base.

In recent years presensitized negative-working lithographic plates that can be converted into printing plates by merely exposing the presensitized plates to a light source through a negative, stencil transparency or the like, followed by washing off the unexposed material have become quite common and widely used. For best results it is desirable that these presensitized plates be capable of being stored for appreciable periods of time in light excluding packages, that when exposed the resulting printing plate be scum free in a non-printing area and be tenaciously adherent to printing ink in the printing area. Thus, those portions of the printing plate where the light sensitive coating was not exposed to light through the blocking action of the negative must be hydrophilic and oleophobic in order to be non-adherent. Similarly those portions of the finished printing plate which were exposed to light must be hydrophobic and organophilic in order to produce a good clear image.

More recently so-called positive-working presensitized lithographic plates have become known. In this case water insoluble photosensitive organic materials, such as certain diazo oxides, are coated onto a treated support member. When such plates are exposed to actinic light under a positive transparency a chemical change occurs in the irradiated portion and it becomes soluble in alkaline solutions. Thus, by inking up an exposed plate and then soaking it in a somewhat alkaline aqueous solution, the exposed areas are dissolved away. After the usual desensitizing steps such a plate may be mounted on a standard lithographic press and yield positive copies from a positive transparency.

One of the features of this invention is to provide an improved lithographic plate base adapted to receive a light sensitive coating to provide a presensitized lithographic plate comprising a metal base member and a coating thereon formed by applying to the metal base member a member of the class consisting of acrylic acid monomers and alkyl homologues.

A further feature of this invention is to provide an improved base which may be used not only for the preparation of presensitized plates, both positive and negative working, but which may also be used with such prior art photosensitizers as bichromated albumin and casein for negative-working "surface" plates and bichromated gum arabic for positive-working "deep-etch" plates.

Another feature of the invention is to provide such a base in which the aluminum base member is coated by applying to the base member an aqueous solution of a member of the class consisting of acrylic acid monomers and alkyl homologues thereof in a concentration of at least about 1.0% by weight and at an elevated temperature.

Other features and advantages of the invention will be apparent from the following description.

The lithographic plate base of this invention uses a metal base member that is preferably copper, tin, aluminum, manganese, zinc or chromium, although others may of course be used if desired. A preferred aluminum base member is one described in Wood Patent 2,240,732 which is primarily aluminum containing about 1.25% manganese.

The lithographic plate has adhered to this base member a novel adherent barrier coating which seals the surface of the base member and particularly the metal base member in that there is no contact between the base member and the subsequently applied overlying light sensitive coating or sensitizer. As a result a presensitized plate formed from the base of this invention has good shelf life and can be stored for long periods of time. In addition the barrier layer is hydrophilic and oleophobic so as to be scum preventing and to reduce tone in the resulting printing plate. Also, it is substantially free of water soluble material. A combination of this barrier layer and the subsequently applied sensitizer also produces extremely long runs of operation so that the printing plate may be used to make several thousand impressions.

I have discovered that hot, dilute, aqueous solutions of monomeric acrylic acid and its homologues will react with metallic surfaces, and especially aluminum surfaces, to yield a superior surface for use with the common sensitizers. This is surprising, because in this reaction these acids, which are alpha, beta-unsaturated acids, differ from other simple organic acids. Moreover, although polymeric acrylic acids will react with cleaned aluminum sheets to yield usable lithographic surfaces, those formed from the monomeric acids are different and superior in several ways. One of the main disadvantages to polyacrylic acid treated surfaces is that after a period of time the surface is less wettable, and, in the case of presensitized plates, it becomes more and more difficult to remove the unreacted sensitizer.

This reaction of the acrylic acid homologues was so surprising when it was first discovered that it was suspected that the monomeric material had been contaminated with polymeric acids even though a polymerization inhibitor was present, and routine testing showed no polymer whatsoever.

*Example 1*

A 3% by weight aqueous solution of acrylic acid, stabilized with 0.05% of the monomethyl ether of hydroquinone (which is a polymerization inhibitor) was heated to 190° F. A sheet of aluminum which had been degreased, etched in an alkaline bath, and pickled in hot chromic acid to remove the smut, was placed in the acid bath for three minutes. On removal from the bath the treated sheet was thoroughly rinsed in running tap water. This washed, treated sheet was coated with the condensation product of formaldehyde and p-diphenylamine sulfate by immersion in a 1% aqueous solution of the latter and squeegeeing off the excess. When exposed to ultra-violet light through a negative transparency and then developed in the usual manner, a plate was produced which could be run for many thousand impressions on a standard lithographic press.

On the basis of various experiments it is believed that the following theory illustrates the course of the reaction between acrylic acid monomers and aluminum and how it differs from the course of the reaction between polyacyrlic acid and aluminum. The invention, however, is not limited to this theory. Polyacrylic acid is a large molecule. Even the lowest molecular weight polyacrylic acid commercially available has an average molecular weight of over 75,000. This would indicate that, on the average, molecules of this low molecular weight material contain something over 1000 carboxy groups attached to a chain of about 2500 carbon atoms. These carboxy groups extend spatially in a random manner from this chain which is either linear or helical, depending on the manner of formation. When this molecule reacts with a cleaned aluminum sheet cartain of the carboxyl groups combine with the aluminum, perhaps through hydrogen bonds. However, others, and probably more than are associated with the aluminum are oriented toward the top, away from the aluminum. Since it is known that carboxylic acid groups are hydrophilic, it is understandable that surfaces so made will be water-receptive and sensitizable with various aqueous solutions. Furthermore, due to labile hydrogen ions present on the surface, other materials which are water insoluble can be bonded through hydrogen bonding. This is borne out by experimental fact.

On the other hand, the monomeric acrylic acids cannot react in this way since, if the bonding to the aluminum were to be through the carboxy groups, the group oriented upward toward the surface would be the hydrocarbon moiety, which is hydrophobic. Therefore, the aluminum surface must act to open the carbon-carbon double bond which then bonds to the surface itself. Then the carboxylic acid groups will be oriented away from the aluminum as is desirable. Furthermore, acrylic acid molecules which have reacted with aluminum will be in an activated state and may react with another molecule of acrylic acid. This results in a surface of superior characteristics in that the interaction of the acrylic acid molecules results in a sub-surface layer which resists the penetration of corrosive materials down to the metal. It has been found that this reaction is characteristic of the acrylic acid homologues as well as of acrylic acid itself.

*Example 2*

The reaction is carried on as described in Example 1, except that a 5% solution of methacrylic acid, inhibited with hydroquinone, is used instead of the acrylic acid of Example 1. Similar results are obtained.

It has also been found that water insoluble diazo compounds, such as the diazo oxide sulfonic acid esters which are used for the preparation of plates by exposure to positive transparencies may be used as sensitizers.

*Example 3*

Plates made by the methods of Examples 1 and 2 were sensitized by whirler coating with a 2% solution of N,N'-4,4'-biphenylene-bis (6,5-diazo-5,6-oxo-1 naphthalenesulfoamide) in dimethyl formamide and dried. This coated plate was exposed to ultra-violet light behind a positive transparency. After exposure this entire surface was evenly coated with a thin layer of a standard surface developing ink and fanned dry. The developing ink was then removed from the exposed areas with a cotton swab saturated with a 10% solution of disodium phosphate. The unexposed portions of the surface held the developing ink tenaciously. After development the plate was desensitized with a standard green desensitizing etch, well known in the art. This plate when mounted on a standard lithographic press gave a large number of excellent copies. It yielded positive prints from a positive transparency.

Plates made by the above methods may be sensitized with the bichromated colloids used for negative (surface) plates or positive (deep-etch) plates.

*Example 4*

Plates made according to Examples 1 and 2 were sensitized by whirler coating with a commercial bichromated casein coating (Harris "Q-Coat"). The plates were exposed to ultra-violet light through a negative transparency. They were then coated with an even, thin coating by being placed for one minute in a tray containing a 1% solution of ammonium hydroxide in water. These plates were removed from the solution and the developing ink was removed from the unexposed areas by flushing with a spray of running water. The plates were then desensitized with a standard plate etch (Harris "Hydro-Etch"). When these plates were run in the usual manner on a standard lithographic press, many excellent impressions were obtained. This plate gave positive copy from a negative transparency.

*Example 5*

A plate made according to the teachings of this invention was whirler coated with a commercial deep-etch coating (Harris Co. "Hidensity"). This plate was dried and exposed to ultra-violet light behind a positive transparency. After exposure the plate was developed with a standard deep-etch developer (Harris "Deep-Etch Developer #1"), and deep-etched with Harris Co. "Deep-Etch Aluminum Etch". The plate was then lacquered, developed with ink and washed out with asphaltum. Afer removal of the stencil the non-image areas of the plate were desensitized. On the press this plate gave many excellent copies. It gave positive copy from a positive transparency.

Another commercially available sensitizer is that known as Kodak Photo Resist, sold by the Eastman Kodak Company, and consisting of a solution of polyvinyl cinnamate and certain activators, such as described in U.S. Patents 2,670,285, 2,670,286, and 2,670,287, in a mixture of organic solvents. When used according to the instructions given by Eastman Kodak Co., as described in Example 6, a strong, long-running plate is produced.

*Example 6*

A plate was made by the teachings of this invention and was sensitized with a photosensitive synthetic resin sold under the trade name "Kodak Photo Resist." After exposure to ultra-violet light behind a negative transparency, the plate was developed with the standard commercial solvents sold for use with this material. This plate was mounted on the press and gave excellent prints. Positive copy was obtained from a negative transparency.

The amount of acrylic acid monomer or alkyl homologue thereof that is present in the aqueous solution used to treat the metal plate is preferably at least about 1.0% by weight. Any amount higher than this can be used as desired but extremely large amounts such as over 10% are uneconomical as they will vaporize and pass out of the heated solution. The aqueous solution used is preferably at a temperature between 180° F. up to the boiling point of water, and the time of the treatment is not overly important, and is only that sufficient to secure a reaction between the compound and the metal sheet. In general this time will vary between 1–10 minutes.

The resulting lithographic plate base may be stored as such and used later by application of the sensitizer as, for instance, it may be shipped to a user and the user himself may apply the sensitizer. If desired, the sensitizer is applied by the manufacturer to produce a presensitized lithographic plate and the resulting plate may be stored in the dark for weeks and even months such as in a light proof storage package. The presensitized plate may then be used in the customary manner.

The light sensitive material that is applied to the thusly produced plate base may be any of the usual types of materials including diazo compounds, bichromated casein and bichromated albumin.

Typical diazo sensitizer ideally suited for use with the prepared base of this invention and typical sensitizers of this type are described in Patents Nos. 2,100,063, 2,667,-415, 2,679,498, and 2,772,972. Such a diazo compound is prepared by condensing paraformaldehyde with p-diazo-diphenylamine sulfate. The dispersion or solution of the sensitizer or light sensitive material may be applied to the prepared by dipping, spraying, roller coating, brushing or the like which are all conventional in this art. Another very effective diazo sensitizer is a 2% solution of N,N'-4,4'-biphenylene-bis(6,5-diazo - 5,6-oxo-1 naphthalenesulfoamide) in dimethyl formamide. This latter sensitizer is a water insoluble diazo compound and is useful in making positive working presensitized plates.

Wherever the term water dispersible is used herein it is intended to include both water soluble and molecular and multimolecular dispersions as well as those dispersions that are dilutable with water.

Having described my invention as related to the embodiments set out herein, it is my intention that the invention be not limited by any of the details of description, unless otherwise specified, but rather be construed broadly within its spirit and scope as set out in the accompanying claims.

I claim:

1. A lithographic plate base for receiving an applied light sensitive coating, consisting essentially of: a metal base member having a coating thereon formed by applying to the base member at an elevated temperature, a water dispersion of a member of the class consisting of an acrylic acid monomer and alkyl homologues thereof.

2. The base of claim 1 wherein said class member is present in the water dispersion in a concentration of at least 1.0% by weight.

3. The base of claim 1 wherein the member of said class is acrylic acid monomer.

4. The base of claim 1 wherein the member of said class is methacrylic acid monomer.

5. A lithographic plate base for receiving an applied light sensitive coating consisting essentially of: a metal base member having a coating thereon formed by applying to the base member at a temperature of from about 180° F. to about 212° F., a water dispersion of acrylic acid monomer.

6. A lithographic plate base for receiving an applied light sensitive coating, consisting essentially of: a metal base member having a coating thereon formed by applying to the base member at a temperature of from about 180° F. to about 212° F., a water dispersion of methacrylic acid monomer.

7. A method for making a lithographic plate base having a coating thereon for receiving an applied light sensitive coating, comprising the steps of: applying to a metal base member, at an elevated temperature, a water dispersion of a member of the class consisting of acrylic acid monomer and alkyl homologues thereof.

8. The method of claim 7 wherein said member of said class is present in the water dispersion in a concentration of at least 1.0% by weight.

9. The method of claim 7 wherein said dispersion is applied at a temperature of between about 180° F. to 212° F.

10. A method for making a lithographic plate base having a coating thereon for receiving an applied light sensitive coating, comprising the steps of: applying to a metal base member at a temperature of between about 180° F. to 212° F. a water dispersion containing at least about 1.0% by weight of acrylic acid monomer.

11. A method for making a lithographic plate base having a coating thereon for receiving an applied light sensitive coating, comprising the steps of: applying to a metal base member at a temperature of between about 180° F. to 212° F. a water dispersion containing at least about 1.0% by weight of methacrylic acid monomer.

References Cited in the file of this patent

UNITED STATES PATENTS

| | | |
|---|---|---|
| 2,186,945 | Wood | Jan. 6, 1940 |
| 2,354,088 | Reichel | July 18, 1944 |
| 2,662,034 | Mason et al. | Dec. 8, 1953 |
| 2,714,066 | Hewett et al. | July 26, 1955 |
| 2,764,085 | Shoemaker et al. | Sept. 25, 1956 |